United States Patent
Lin

(10) Patent No.: US 9,329,251 B2
(45) Date of Patent: May 3, 2016

(54) SYSTEM AND METHOD FOR MAGNETIC RESONANCE IMAGING USING MULTIPLE SPATIAL ENCODING MAGNETIC FIELDS

(75) Inventor: Fa-Hsuan Lin, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 835 days.

(21) Appl. No.: 13/463,847

(22) Filed: May 4, 2012

(65) Prior Publication Data

US 2013/0293229 A1 Nov. 7, 2013

(51) Int. Cl.
*G01R 33/483* (2006.01)

(52) U.S. Cl.
CPC ................... *G01R 33/483* (2013.01)

(58) Field of Classification Search
CPC ...................................... G01R 33/483
See application file for complete search history.

(56) References Cited

U.S. PATENT DOCUMENTS

| | | | | |
|---|---|---|---|---|
| 7,411,395 B2* | 8/2008 | Hennig | | G01R 33/385 324/307 |
| 7,902,825 B2* | 3/2011 | Bammer | | G01R 33/56341 324/307 |
| 7,906,968 B2* | 3/2011 | Hennig | | G01R 33/385 324/318 |
| 2007/0090838 A1 | 4/2007 | Hennig | | |
| 2009/0284257 A1* | 11/2009 | Bammer | | G01R 33/56509 324/307 |
| 2013/0181711 A1* | 7/2013 | Chaari | | G01R 33/5611 324/309 |
| 2014/0097845 A1* | 4/2014 | Liu | | G01R 33/5611 324/322 |

OTHER PUBLICATIONS

Hennings et al., "Parallel imaging in non-bijective, curvilinear magnetic field gradients: a concept study", Magnetic Resonance Mater Physics, (DOI 10.1007/s10334-008-0105-7), (2008) 21: pp. 5-14.*

* cited by examiner

*Primary Examiner* — Dixomara Vargas
(74) *Attorney, Agent, or Firm* — Bacon & Thomas, PLLC

(57) ABSTRACT

This invention provides a multi-dimensional encoded (MDE) magnetic resonance imaging (MRI) scheme to map a q-dimensional object with p spatial encoding magnetic fields (SEMs) onto a p-dimensional space where p is equal to or larger than q. The provided MDE MRI scheme links imaging schemes using linear and nonlinear gradients. The present invention also provides a system and method of optimizing the spatial bases in MDE MRI. With a higher dimension encoding space in MDE MRI, the image can be reconstructed in a more efficiency and accurate manner.

6 Claims, 9 Drawing Sheets

SYSTEM AND METHOD FOR MAGNETIC RESONANCE IMAGING USING MULTIPLE SPATIAL ENCODING MAGNETIC FIELDS

BACKGROUND OF THE INVENTION

1. Field of the Invention

The present invention relates to systems and methods for magnetic resonance imaging (MRI). More particularly, the present invention relates to systems and methods for MRI spatial encoding and image reconstruction.

2. Description of the Prior Art

MRI uses the nuclear magnetic resonance (NMR) phenomenon to produce images. When a substance such as human tissue is subjected to a uniform magnetic field (polarizing field $B_0$), the individual magnetic moments of the nuclei in the tissue attempt to align with this polarizing field, and precess about it at their characteristic Larmor frequency. If the substance, or tissue, is subjected to a radio frequency (RF) magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins", after the excitation field $B_1$ is terminated, and this signal may be received and further processed to form, or to reconstruct, an image.

Conventional MRI employs temporally and spatially variable magnetic fields to encode the position by the local Larmor frequency of spins. To this end, the gradient systems applied for MRI are designed to produce spatially linearly varying fields (i.e. constant gradients) in three orthogonal directions x, y, z, which lead to a direct mapping of the local resonance frequencies to spatial coordinates. Through the constant gradients, images of the substance, or human tissue, without distortions may be produced after Fourier transformation of the time domain signals. Constant gradients are advantageous in the constant voxel size, and in that the signal intensities across the image can be directly compared without the need for any volumetric correction. The use of constant gradients to encode the physical parameter also allows for isotropic parameter encoding.

By switching orthogonal linear gradients, the localization of magnetic resonance (MR) signals is commonly achieved to obtain a bijective mapping between the magnetization precession frequencies and spatial locations. Specifically, the incremental gradient moment (time integral of the gradient strength) between consecutive data samples and the maximal gradient moment respectively corresponds to the field-of-view (FOV) and the spatial resolution based on the Nyquist sampling theorem. This imaging principle is applied for mapping, for example, a three dimensional object, onto a three dimensional k-space, each sample of which measures the projection of the object to be imaged onto one specific three-dimensional spatial harmonic function. Spatial encoding using orthogonal linear gradients is advantageous in that the images can be reconstructed efficiently and uniquely using the fast Fourier transformation when acquired data satisfy the Nyquist sampling theorem and the data locate on evenly separated Cartesian grids.

Instead of using linear gradients, nonlinear gradients are used to improve the dynamic range of MR signals and to localize NMR signals without using selective excitation. Recently, it has been suggested that parallel imaging technique using localized gradients (PatLoc) can achieve high spatial resolution images and reduce the peripheral nerve stimulation hazard by using nonlinear surface gradient elements and an RF receiver array. O-space imaging is suggested to be a different imaging approach using the Z2 magnetic field gradient together with the x- and y-gradients to make the high resolution accelerated images. The use of nonlinear imaging gradients, however, makes the images have anisotropic spatial resolution and makes the image reconstruction become more complicated.

It is desired to develop a new approach for encoding the object and for reconstructing the image thereof with an MRI system to improve the reconstruction resolution and to save the time necessary for the same.

SUMMARY OF THE INVENTION

In views of the above, the present invention overcomes the drawbacks of the prior art technology by providing a multi-dimensional encoded (MDE) MRI scheme capable of reconstructing an image more efficiently and accurately.

The present invention provides a method of optimizing the spatial bases in MDE MRI, whereby the MDE MRI links the imaging strategies using linear and nonlinear gradients, and allows for mapping a q dimensional object onto a p dimensional encoding space (where p>q).

The present invention provides a method of encoding an object for MRI, so as to reduce the reconstruction error and to enhance the resolution in imaging.

It is an aspect of the present invention to provide a magnetic resonance imaging (MRI) system to image a q-dimensional object. The provided MRI system is equipped with a subsystem generating a number of m of spatial encoding magnetic fields (SEMs) to encode an excited magnetization and a number of p of receiver coils for detecting the excited magnetization. The generated SEMs are spatially bijective or non-bijective within a selected field-of-view, with m being equal to or larger than q, and the receiver coils have a number of spatially distinct sensitivity maps which is equal to or less than p.

Preferably, the generated SEMs are applied to measure a plurality of spatially encoded signals, each of which has a fixed spatial distribution and a time varying or stationary strength.

Preferably, at least one of the generated SEMs for the provided MRI system is monotonically spatially varying.

Preferably, at least one of the generated SEMs for the provided MRI system is spatially non-bijective.

Preferably, the SEMs are generated by a plurality of stationary and spatially localized current loops with a time varying strength.

It is a further aspect of the present invention to provide a method of generating magnetic resonance images of a q-dimensional object using a magnetic resonance imaging (MRI) system having a subsystem generating a number of m of spatial encoding magnetic fields (SEMs) to encode an excited magnetization and a number of p of receiver coils for detecting the excited magnetization. The provided method includes step of a) choosing SEMs b) determining, for each of the chosen SEMs, a corresponding spatial basis from the rise time, duration, strength, and ramp-down time of the chosen SEM; and c) reconstructing an image of the n-dimensional object based on data points obtained at each of the receiver coils at each of the spatial bases.

Preferably, the generated SEMs are spatially bijective or non-bijective within the selected field-of-view, with m being equal to or larger than q, and wherein the receiver coils have a number of spatially distinct sensitivity maps which is equal to or less than p.

Preferably, at the step a) of the provided method, the SEMs are generated with at least one linear gradient coils.

Preferably, the step b) of the provided method includes the following steps to determine the spatial basis: b1) selecting a target object and calculating, for each of the chosen SEMs, a projection coefficient as a spatial integral over the selected field-of-view as the product between the target object, the chosen spatial basis, which is defined as a spatial distribution of complex values, and the sensitivity map of one channel of the receiver array; b2) choosing the largest projection coefficient from a collection of the projection coefficients obtained at the step b1) and its SEM spatial distribution, strength, and duration; b3) using the chosen SEM at the step b2) to get the one data point from each of the receiver coils; b4) subtracting the product of the chosen projection coefficient, the sensitivity map of each channel of the receiver array, and the chosen spatial basis from the target object; and b4) repeating the steps b1), b2) and b3) for all of the data points obtained at the receiver coils.

Preferably, the defined spatial distribution of complex values at the step b1) have the same magnitudes over the selected field-of-view and different phases at different locations in the selected field-of-view.

Preferably, the respective phase of the spatial basis is defined as a spatial distribution of complex numbers of unit length and different phases, which are proportional to the product of the magnetic field strength of the chosen SEM, the strength of driving current for the chosen SEM, and the duration of the chosen SEM.

It is still a further aspect of the present invention to provide a computer program proceeded by a processor for generating magnetic resonance images of a q-dimensional object with a magnetic resonance imaging (MRI) system having a subsystem generating a number of m of spatial encoding magnetic fields (SEMs) to encode an excited magnetization and a number of p of receiver coils for detecting the excited magnetization, the computer program comprising routine for choosing, from the generated SEMs, one of the SEMs may having monotonically increasing field strength and direction distributions or non-monotonically increasing field strength and direction distributions within a selected field-of-view; routine for determining, for each of the chosen SEMs, a corresponding spatial basis from the rise time, duration, and ramp-down time of the chosen SEM; and routine for reconstructing an image of the n-dimensional object based on data points obtained at each of the receiver coils at each of the spatial bases. The generated SEMs are spatially bijective or non-bijective within the selected field-of-view, with m being equal to or larger than q, and wherein the receiver coils have a number of spatially distinct sensitivity maps which is equal to or less than p.

DETAILED DESCRIPTION OF THE PREFERRED EMBODIMENTS

The present invention will be described more fully hereinafter with reference to the accompanying drawings, in which preferred embodiments of the present invention are shown.

Figure 1:
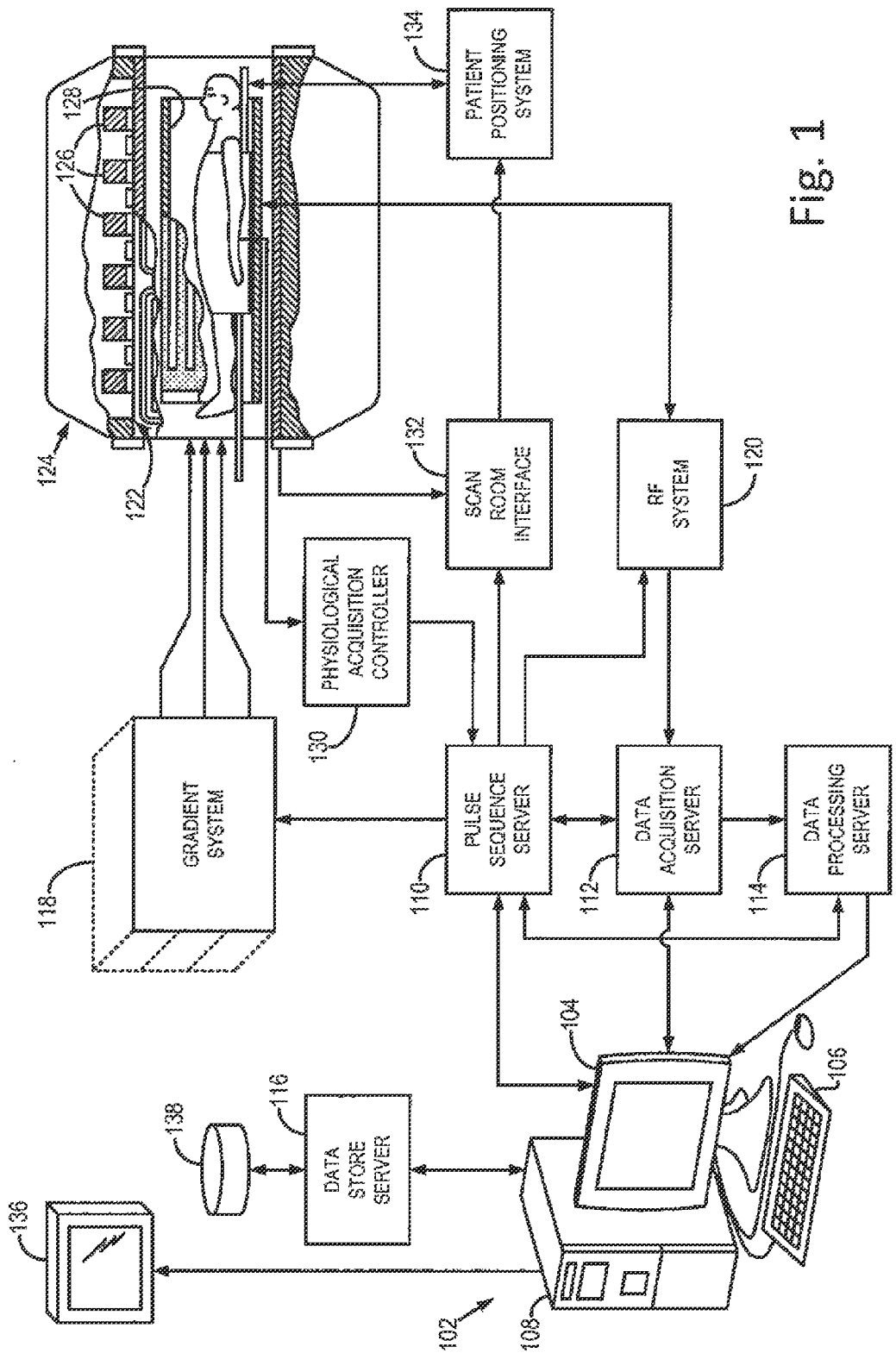
FIG. 1 is a block diagram showing an exemplary magnetic resonance imaging (MRI) system employs the present invention.

With reference to FIG. 1, the preferred embodiment of the invention is employed in a magnetic resonance imaging (MRI) system. The details of such MRI system are also described in the pending US application, U.S. patent application Ser. No. 12/762,922, which is herein incorporated by reference in its entirety.

In more details, the MRI system 100 includes a workstation 102 having a display 104, a keyboard 106 and a processor 108 such as a commercially available programmable machine running a commercially available operating system. The workstation 102 provides the operator interface that enables scan prescriptions to be entered into the MRI system 100. The workstation 102 is coupled to four servers, including a pulse sequence server 110, a data acquisition server 112, a data processing server 114 and a data store server 116. The workstation 102 and each of the four servers 110, 112, 114 and 116 are connected to communicate with each other.

The MRI system 100 is provided with a gradient system 118 and a radiofrequency (RF) system 120, which are operated by the pulse sequence server 110 in response to instructions downloaded from the workstation 102. Gradient waveforms necessary to perform the prescribed scan are produced and applied to the gradient system 118, which excites gradient coils in an assembly 122 to produce the magnetic field gradients $G_x$, $G_y$ and $G_z$ used for position encoding MR signals. The gradient coil assembly 122 forms part of a magnet assembly 124 that includes a polarizing magnet 126 and a whole body RF coil 128.

Upon the operation, RF excitation waveforms are applied to the RF coils 128 by the RF system 120 to perform the prescribed magnetic resonance pulse sequence. Responsive MR signals detected by the RF coil 128 are received by the RF system 128, and are amplified, demodulated, filtered and digitized under commands produced by the pulse sequence server 110. The RF system 120 includes an RF transmitter for producing a wide variety of RF pulses used in MR pulse sequence. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The MRI system 100 may be further equipped with a physiological acquisition controller 130 and a scan room interface circuit 132, which receive the signals from a number of different sensors connected to the patient and the signals from various sensors associated with the condition of the patient and the magnet system, respectively.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during the prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. The data acquisition server 112 may also be employed to process MR signals used to detect the arrival of contrast agent in a magnetic resonance angiography (MRA) scan. In all these examples, the data acquisition server 112 acquires MR data and processes it in real-time to produce information that is used to control the scan.

Upon the operation, the data processing server 114 receives the MR data from the data acquisition server 112 and processes it in accordance with instructions downloaded from the workstation 102. Such processing may include such as Fourier transformation of raw k-space MR data to produce the two or three-dimensional images; the application of filters to a reconstructed image; the performance of a back projection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to the operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

The MRI system 100 is used to image a q-dimensional object. For the present invention, the gradient system 118 of the MRI system 100 is applied for generating a number of m of spatial encoding magnetic fields (SEMs) to encode an excited magnetization with m being equal to or larger than q. The excited magnetization for imaging is detected by the RF coil 128 which includes a number of p of receiver coils. The generated SEMs are spatially bijective or non-bijective within a selected field-of-view, and the receiver coils have a number of spatially distinct sensitivity maps which is equal to or less than p.

Figure 2:
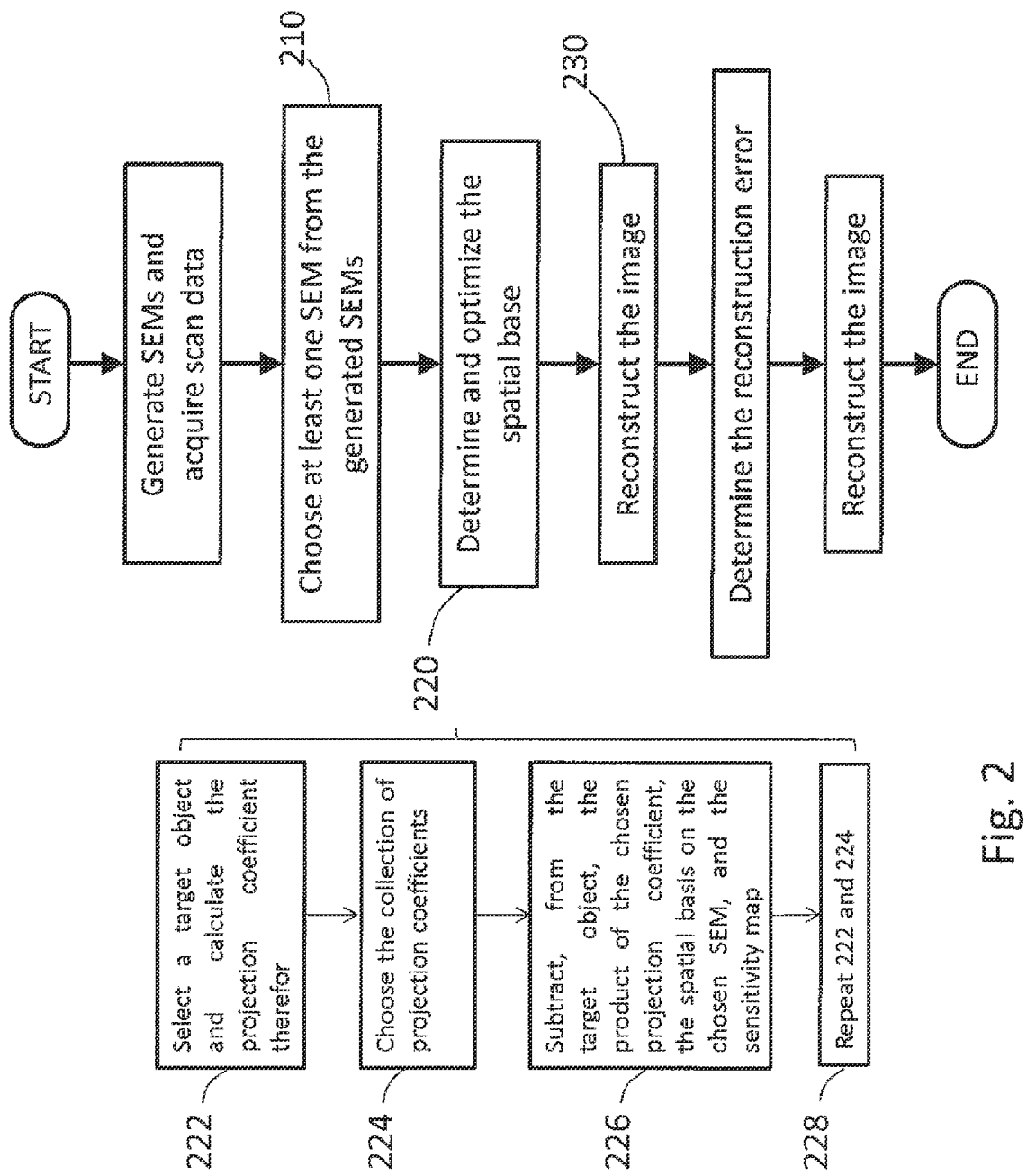
FIG. 2 is a flowchart showing the steps of an exemplary method for reconstructing an image of a subject in accordance with a preferred embodiment of the present invention.

In order to improve the MRI spatial encoding and image reconstruction, the present invention proposes a multidimensional encoded (MDE) MRI scheme capable of reconstructing an image more efficiently and accurately by using the over-complete spatial bases for encoding an object into a higher dimensional space. With reference to FIG. 2, which is a flowchart showing the steps of an exemplary method for reconstructing the image in accordance with the present invention, the details of the method employing the MDE MRI scheme and the principle thereof are illustrated as below.

The method according to the present invention begins at acquiring the scan data with the MRI system as mentioned, from a q-dimensional object, and thereby the image thereof is reconstructed as below.

At the step 210, at least one of SEMs is chosen from the generated m SEMs. The chosen SEM has monotonically increasing field strength and direction distributions or non-monotonically increasing field strength and direction distributions within a selected field-of-view. Second, at the step 220, corresponding to each of the chosen SEMs, a corresponding spatial basis is determined from the rise time, duration, and ramp-down time of the chosen SEM. In a preferred embodiment of the present invention, the determining of spatial basis is carried out by the following steps 222-228. At the step 222, a target object is selected, and for each of the chosen SEMs, a projection coefficient is calculated as a spatial integral over the selected field-of-view about a product between the target object and the chosen spatial basis, which is defined as a spatial distribution of complex values, and the sensitivity map of one channel of the receiver array. The chosen spatial basis is defined as a spatial distribution of complex values determined by the SEM strength and duration. Then, at the step 224, a collection of projection coefficients is chosen from the projection coefficients obtained at the step 222 based on a chosen combination of the spatial distribution, strength, and duration of the SEMs and the sensitivity map of one channel of the receiver array. The collection of projection coefficients as chosen contains the respective data point at each of the receiver coil array. At the step 226, the product of one chosen projection coefficient, the spatial basis based on the chosen SEM spatial pattern, strength, and duration, and the sensitivity map from all channels of the receiver coil array is subtracted from the target object. Following the step 226, the spatial bases are determined by repeating the steps 222 and 224 for all of the data points obtained at the receiver coils, as indicated at the step 228.

Afterwards, at the step of 230, the image of the q-dimensional object is reconstructed based on the data points obtained at each of the receiver coils at each of the spatial bases.

The principles of the present invention and the details for establishing the signal distribution, or the so-called signal equation, for the MDE MRI are further illustrated in the following.

In more specific, the signal equation describes the measurement for MRI as the spatial integral of the unknown image $\rho(r)$ weighted by the RF coil sensitivity $C_\lambda(r)$ and the spatial harmonics controlled by the time integral of spatial encoding magnetic fields, as shown in Eq. (1).

$$s(\lambda, t) = c_\lambda(r)\rho(r)\exp{-2\pi j\gamma \sum_{i=1}^{q} \int_{\tau=0}^{t} SEM_i(r, \tau)d\tau}\, dr \quad \lambda = 1\cdots n_C \qquad \text{Eq. (1)}$$

where r denotes the spatial location, $\lambda$ specifies the index to one RF coil channel, $\gamma$ is the gyromagnetic ratio, and $n_c$ is the total number of channels in an RF coil array. For a preferred embodiment of the present invention, $n_c$ is set to be 8 since an eight-channel surface gradient system together with eight circular RF coils is used. $SEM_i(r,\tau)$ represents the spatial encoding magnetic field i at the location r and the time $\tau$. t indicates the lapsed time after turning on the $i^{th}$ SEM. q denotes the total number of SEMs and also the dimension of the encoding space. It should be noted that using q linear gradients to map one q-dimensional object makes Eq. (1) degenerate to classical Fourier encoded MRI.

If the strength of an SEM is normalized, the MDE MRI signals would be specified by a table listing data acquisition time instants and SEM strengths, as shown in Eq. (2).

$$s(\lambda, t_k) = \int c_\lambda(r)\rho(r)\exp\left(-2\pi j\gamma \sum_{i=1}^{q} SEM_i^0(r)\int_{\tau=0}^{t_k} p_i(\tau)d\tau\right) dr \quad \lambda = 1\cdots n_C \quad \text{Eq. (2)}$$

where $SEM_i^0(r,\tau)$ represents the normalized spatial encoding magnetic field i generated by a unit current on the gradient coils at the location r. $p_i(\tau)$ denotes the strength of the $i^{th}$ normalized SEM at the time $\tau$. $t_k$ indicates the $k^{th}$ sampling time instant. The moments of SEMs $p_i(\tau)$ parameterized by the strength and the evolution time (including polarity) of a SEM can be represented on a q-dimensional encoding space. For a conventional case, this encoding space may be equivalent to the traditional k-space when only linear gradients are used, that is, the mapping of a three-dimensional object onto a three-dimensional encoding space (k-space). In comparison, the method of the present invention is capable of mapping a two-dimensional object onto a five-dimensional encoding space, which will be further illustrated in the following.

In order to describe each spatial basis corresponding to a particular SEM by its spatial pattern $SEM_i^0(r,\tau)$ and its moment $\psi_i(t_k)$, Eq. (2) can be simplified as the following Eq. (3):

$$s(\lambda, t_k) = \int c_\lambda(\tau)\rho(\tau)\exp\left(-2\pi j\gamma\left(\sum_{i=1}^{q}(SEM_i^0(\tau)\psi_i(t_k))\right)\right)d\tau \quad \text{Eq. (3)}$$

$$\psi_i(t_k) = \int_{\tau=0}^{t_k} p_i(\tau)d\tau, \lambda = 1\cdots n_c$$

The mentioned equation describes how the signals are generated in MDE MRI, but gives no explicit information about the size of FOV and the spatial resolution. It should be noted that, for the conventional MRI using linear gradients, the k-space formalism clearly describes the FOV and the spatial resolution in classical Fourier MRI; while for the MDE MRI of the present invention, the k-space would become spatially varying because of the use of nonlinear SEMs. Nevertheless, it is possible to examine the spatial resolution in the PatLoc imaging by using the concept of local k-space. That is, similar to the conventional MRI, k-space coordinates can be derived for MDE MRI as the partial spatial derivative of the phase accumulated across normalized $SEM_i^0$ (r,τ)'s and their waveform $p_i(\tau)$'s.

$$k_x(t_k, r) = \frac{\partial}{\partial x} - j2\pi\gamma\left[\int_{\tau=0}^{t_k}\sum_{i=1}^{q} p_i(\tau)SEM_i^0(r, \tau)d\tau\right] \quad \text{Eq. (4)}$$

$$= \frac{\partial}{\partial x} - j2\pi\gamma\left[\sum_{i=1}^{q} \psi_i(t_k)SEM_i^0(r, \tau)\right]$$

The mentioned equation describes the x coordinate of the k-space data point collected at $t_k$ for image pixel at r. Similarly, the y- and z-coordinates for the k-space data point collected at $t_k$ for the image pixel at r can be derived by replacing the partial derivative with respect to the y and z respectively. Using this location-dependent k-space description, the size of the FOV and the spatial resolution can be directly derived for each image voxel using $SEM_i^0(r,\tau)$ and its moment $\psi_i(t_k)$.

Figure 3:
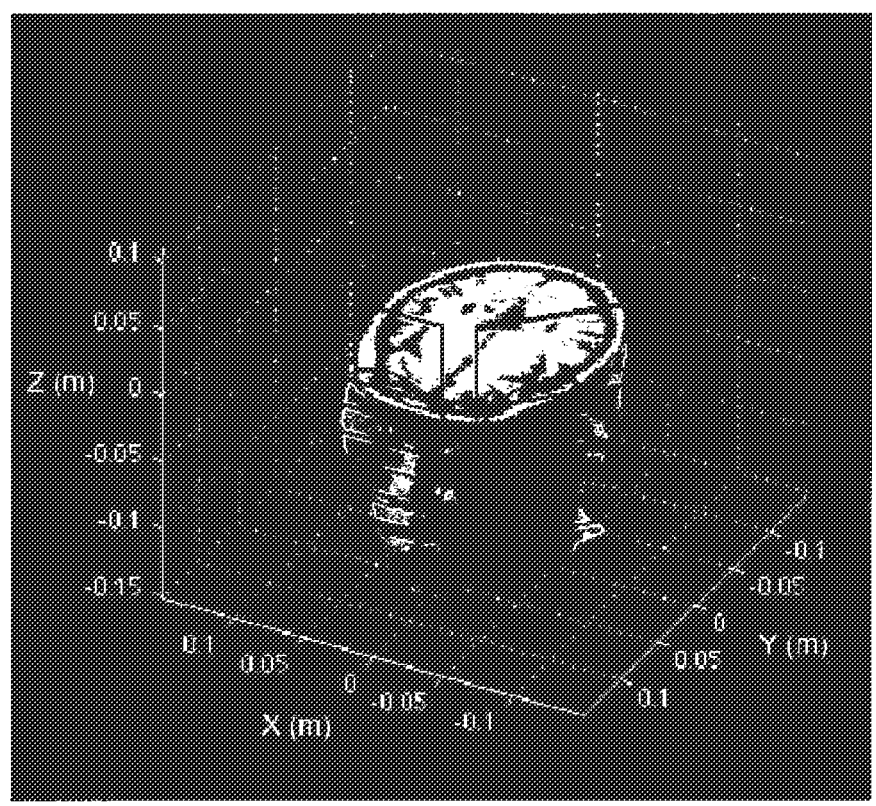
FIG. 3 schematically shows the PatLoc system consisting of eight surface gradient elements (shown in blue) and an eight-channel RF coil array (shown in red) for generating the gradients for the MDE MRI in accordance with a preferred embodiment of the present invention.
Figure 4:
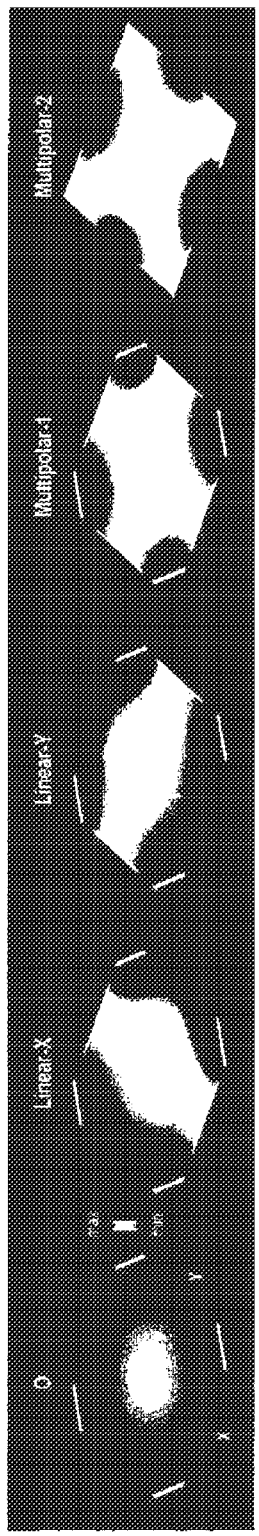
FIG. 4 shows the SEMs used for the MDE MRI according to a preferred embodiment of the present invention.

In the present invention, five specific patterns of SEMs, including the O-shape, Linear-X, Linear-Y, Multipolar-1 and Multipolar-2 patterns, for the scan data are provided for image reconstruction. These SEMs may be spatially bijective or nonbijective within the field-of-view as selected, and are generated by an eight-channel surface gradient system of FIG. 3. As shown in FIG. 3, the surface gradient system is comprised of eight surface gradient elements (shown in blue) with a circumferential geometry, each of which consisting of a symmetric pair of planar gradient coils about the x-y plane. FIG. 3 also shows an eight-channel RF coil array (shown in Red) equipped in the MRI system. The five specific patterns of SEMs for the MDE MRI of the present invention are shown in FIG. 4.

According to the present invention, the configurations of SEMs used in MDE MRI are generated by combining these patterns of SEMs. Among these configurations, the "G5" configuration uses all five SEMs shown in FIG. 4. The "M4" configuration includes two multipolar SEMs (Multipolar 1+Multipolar 2) and two linear SEMs shown in FIG. 4. The "M2" configuration uses only the two multipolar SEMs. The "O3" configuration uses the O SEM together with two linear SEMs, similar to that is the O-space imaging setup. The "L2" configuration is the traditional MRI using two linear gradients for the purpose of comparison. Besides, the magnetic field moments corresponding to Linear-X, Linear-Y, O, Multipolar-1, and Multipolar-2 SEMs are $\psi_x$, $\psi_y$, $\psi_o$, $\psi_{m1}$, and $\psi_{m2}$, respectively. Table 1 lists the five different patterns of SEMs with the associated moments $\psi_i$ and a corresponding encoding dimension q thereof.

TABLE 1

| Configuration of SEMs for MDE MRI | SEMs | $\psi_i$ (i = 1~q) | q |
|---|---|---|---|
| G5 | Linear-X, Linear-Y, Multipolar-1, Multipolar-2, O | $\psi_x, \psi_y, \psi_{m1}, \psi_{m2}, \psi_o$ | 5 |
| M4 | Linear-X, Linear-Y, Multipolar-1, Multipolar-2 | $\psi_x, \psi_y, \psi_{m1}, \psi_{m2}$ | 4 |
| O3 | Linear-X, Linear-Y, O | $\psi_x, \psi_y, \psi_o$ | 3 |
| M2 | Multipolar-1, Multipolar-2 | $\psi_{m1}, \psi_{m2}$ | 2 |
| L2 | Linear-X, Linear-Y | $\psi_x, \psi_y$ | 2 |

As mentioned, a spatial basis corresponding to the respective configuration of SEM for MDE MRI is determined at the step 220, which further includes the steps 222-228. According to the preferred embodiment of the present invention, the spatial bases of the MDE MRI may be jointly determined by its spatial pattern, or configuration, $SEM_i^0(r,\tau)$ and its moment $\psi_i(t_k)$ from Eq. (3). Given the $SEM_i^0(r,\tau)$ and a target object $\rho(r)$, it is applicable to use the Matching Pursuit algorithm to optimize $\psi_i(t_k)$ with the constraint that the number of measurements $s(\lambda,t_k)=n$. Specifically, it is started from k=1 and setting $\psi_i(t_k)=0$, with i=1 to q (the center of the encoding space) for all SEMs. From the measurement k=2, $n_{samp}$ (random numbers following an exponential distribution) are created as $y_i(t_k)$ for the $i^{th}$ SEM (i=1, 2, ..., q). All $(q)^{(n_{samp})}$ combinations of $y_i(t_k)$ across SEM index i are used to create different spatial bases, each of which may correspond to $$\exp\left(-2\pi j\gamma \sum_{i=1}^{m}(SEM_i^0(r)\psi_i(t_k))\right).$$

According to a preferred embodiment of the present invention, one axial slice image is selected as the target object $\rho(r)$ in optimizing, optionally, the MDE MRI data acquisition. The target object $\rho(r)$ is then projected onto each spatial basis and a projection coefficient was calculated by integrating the spatial basis and the target object over space. Among all $(q)^{\wedge}$ ($n_{samp}$) projection coefficients, the spatial basis with the largest projection coefficients is chosen as the optimal basis for this measurement k. To optimize the moment of the respective configuration of SEM at each date acquisition, this procedure may be repeated by incrementing the measurement index k until k=n. In the preferred embodiment, it is assumed that each SEM is turned on instantaneously with a fixed strength over the interval $(0, t_k)$ for the purpose of simplicity. Such assumption is commonly used in the phase encoding in traditional MRI.

With the providing of SEMs and the respective associated moments thereof, measurements are calculated using the mentioned Eq. (5) explicitly, and the images of the object may be reconstructed using the iterative time-domain reconstruction (iTDR) method based on the given measurements, the SEMs, and the SEM moments. The iTDR method is a generalization of the SENSE image reconstruction with arbitrary k-space trajectories using the conjugated gradient method.

In the preferred embodiment of the present invention, the one two-dimension (p=2) high-resolution 3D T1-weighted structural MRI data are used for simulation. The pulse sequence is selected as MPRAGE (TR/TE/flip=2530 ms/3.49 ms/7°, partition thickness=1.0 mm, matrix=256×256, 256 partitions, FOV=256 mm×256 mm).

Optionally, the reconstruction error is further determined as the sum of the absolute value of the difference image between the target object and the reconstruction. Preferably, a different slice is chosen as a further target object to simulate the measurements as mentioned. Finally, the image is reconstructed using the optimized spatial bases obtained at the step 220 and optionally, the determined reconstruction error obtained. In practice, all of the mentioned calculations may be implemented by Matlab (Mathworks, Natick, Mass., USA) using a 128×128 image matrix.

Figure 5:
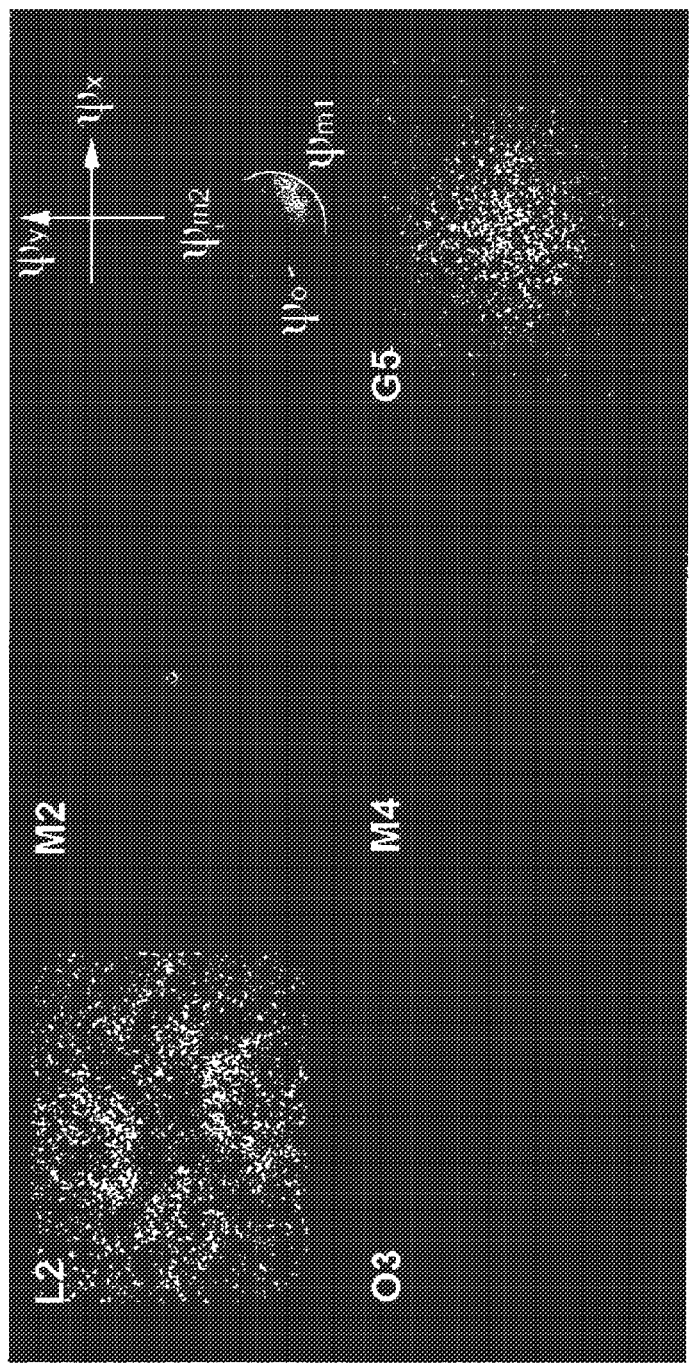
FIG. 5 shows the optimized SEM moments in accordance with a preferred embodiment of the present invention.

In a preferred embodiment, in order to determine the effect of MDE MRI scheme in encoding the object in an accelerated acquisition, the present method is carried out under the 4-fold (R=4) and 8-fold (R=8) accelerations, respectively, where the acceleration rate R is defined as m/n (where m is the number of voxels representing the image to be reconstructed, and n is the number of time points at which the measurements are taken; the size of encoding matrix E would be defined as ($n_c$×n) by m). As an example, FIG. 5 shows the optimized SEM moments $\psi_i(t_k)$ of the 4-fold acceleration, each of which corresponds to a data point in a multi-dimensional encoding space. It should be noted that the combination of colors and x-y coordinates are used to represent the encoding data points of the present MDE MRI for the five configurations due to the high dimension. Among these configurations, the L2 configuration shows a slightly higher density at the center of the encoding space. It should be noted that when only linear SEMs are used, the encoding space would be equivalent to the k-space in the conventional MRI, and thus the optimized moments $\psi_i(t_k)$ for the L2 configuration would match the finding that MRI generally has a higher weighting toward the low spatial frequency components. According to the present invention, the M2 configuration is composed of two multipolar SEMs, but neither linear-X nor linear-Y ones. Thus, it is shown that the optimized moments $\psi_i(t_k)$ are multiple data points at the origin of the encoding space with different combinations of green and blue colors with different intensities. The O3 configuration shows $\psi_i(t_k)$ with distributed red color dots of different intensities. The high intensity red color and a higher density at the center of the encoding space indicate that low spatial frequency components in linear-X, linear-Y, and O SEMs contributed significantly to the target image. The optimized $\psi_i(t_k)$ for the M4 configuration are distributed cyan/blue color dots with a higher density at the center of the encoding space. These data points used different blue/cyan color because only green (for $\psi_{m1}$) and blue (for $\psi_{m2}$) colors were used to represent the moments of the multipolar SEMs. The optimized $\psi_i(t_k)$ for the G5 configuration are multiple color dots. The center of the encoding space has a higher density of the acquisition and their moments are in bright or white colors. Both indicate the spatial harmonics of lower frequencies have higher weightings.

Figure 6:
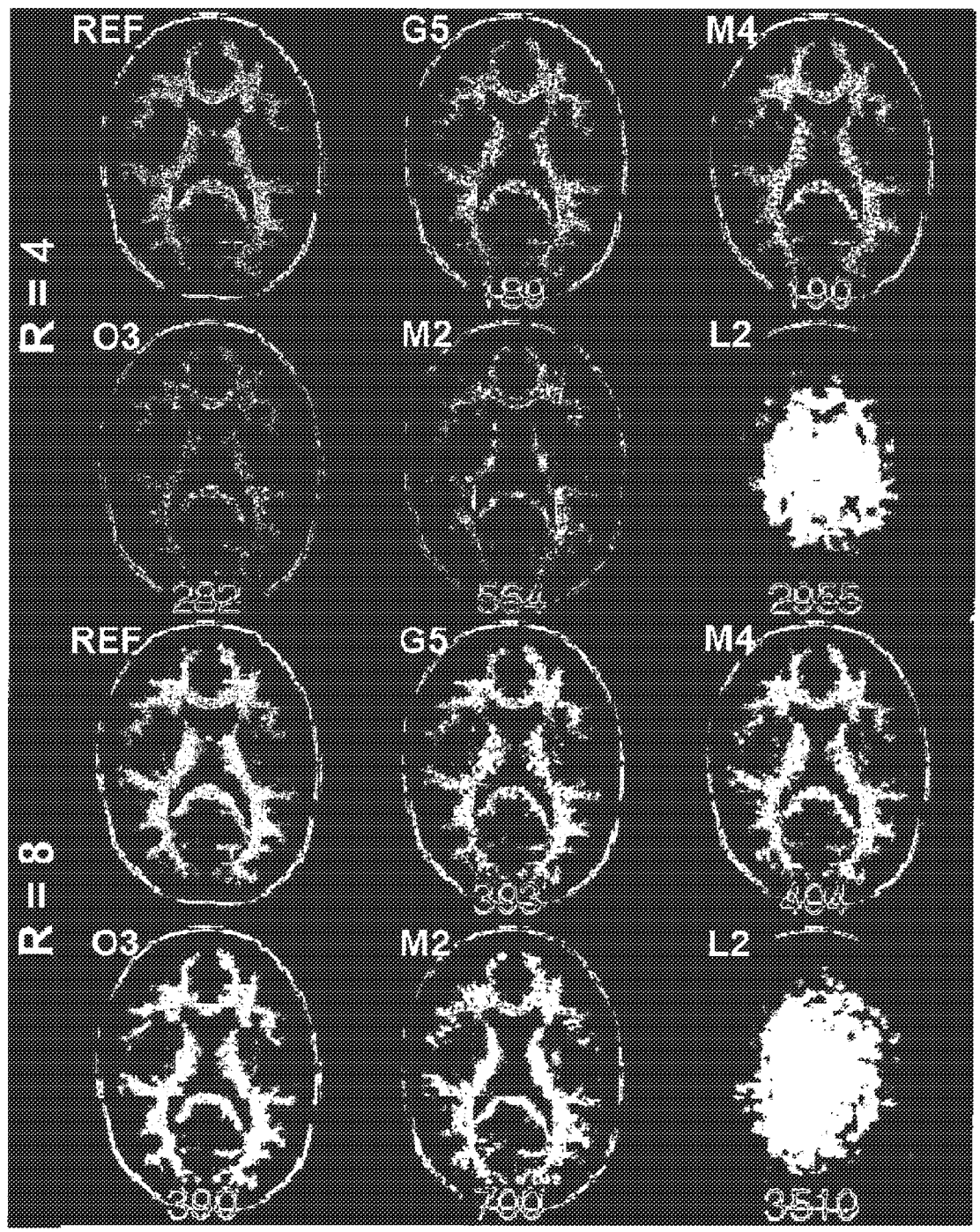
FIG. 6 shows a 4-fold (R=4) and a 8-fold (R=8) accelerated MDE MRI reconstructions according to a preferred embodiment of the present invention.

Using the optimized spatial bases, the acquisition is determined and the images are reconstructed in the 4-fold (R=4) and 8-fold (R=8) accelerations, respectively. FIG. 6 shows the reconstructed images using the L2, M2, O3, M4, and G5 SEMs, respectively. The reference image (REF) is also shown in FIG. 6 for comparison. Besides, the residual errors of the reconstructions are listed at the bottom of each configuration shown in FIG. 6 in cyan. As shown in FIG. 6, the largest reconstruction error is found for the L2 configuration, i.e. the SEM composed of merely linear gradients, with noticeable strips artifacts over the whole field of view (FOV). It is found that the M2 configuration also has a relatively high reconstruction error and the resolution at the center of the FOV is reduced because of ill-conditioning of the SEM and RF encoding in that area. The O3 configuration improves the reconstruction error, while the reconstructed image is still blurred. The M4 configuration generates the reconstruction with a smaller error than the O3 reconstruction, and areas around the $3^{rd}$ ventricle in the center of the FOV also shows more clearly defined boundary. Among these configurations of SEMs, the G5 configuration has a reconstruction of the least error and the quality of the image at the cortical and subcortical areas are enhanced and acceptable.

FIG. 6 also shows the image reconstruction of the 8-fold (R=8) accelerated acquisition. Compared to the reconstruction at the 4-fold acceleration, the reconstruction error is typically found larger. As shown, the L2 configuration fails to generate the reasonable anatomical structures. The respective reconstructions for the M2 configuration and the O3 configuration have a prominently lower spatial resolution in the FOV center and blurring across the FOV. The spatial resolution of respective reconstructions for the M4 and G5 configuration is acceptable but the reconstruction noise thereof is somewhat stronger than 4-fold acceleration. In the 8-fold acquisition, it is found that the O3 configuration gives the least reconstruction error, which is marginally smaller than that of the G5 configuration.

Figure 7:
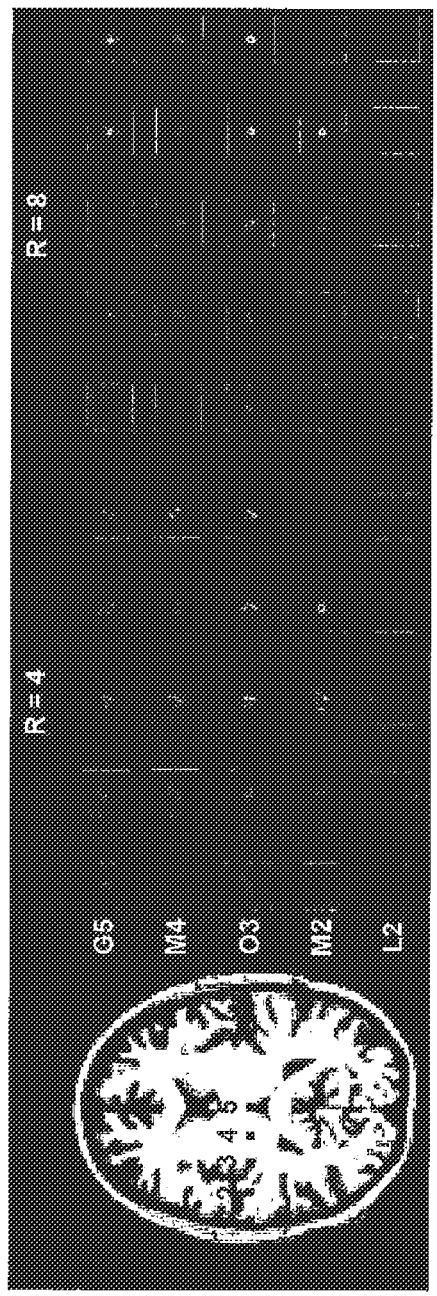
FIG. 7 shows the local k-space of the image reconstruction in the MDE MRI according to a preferred embodiment of the present invention.

FIG. 7 shows the respective local k-space at five locations, indicated by small red boxes at the left thereof, for the 4-fold and 8-fold accelerated MDE MRI, from which the respective spatial resolution thereof can be qualitatively determined: a wider extension of the local k-space corresponds to a higher spatial resolution, that is, the respective local k-space has a white box indicating the boundary corresponding to the inverse of the spatial resolution. As shown in FIG. 7, the L2 configurations have identical local k-space in all five locations. This result matches to the fact of spatially invariant k-space in the traditional MRI using linear gradients. The M2 configuration has no spatial resolution at the center of the FOV, where the local k-space thereof is degenerated to a single point, and the spatial resolution grows gradually as the location moves toward the periphery of the FOV. The O3 and M4 configurations have improved spatial resolution at the FOV center as the local k-space has a wider coverage. The G5 configuration further improved the spatial resolution at the center and the periphery of the FOV by showing more distributed local k-space.

Figure 8A:
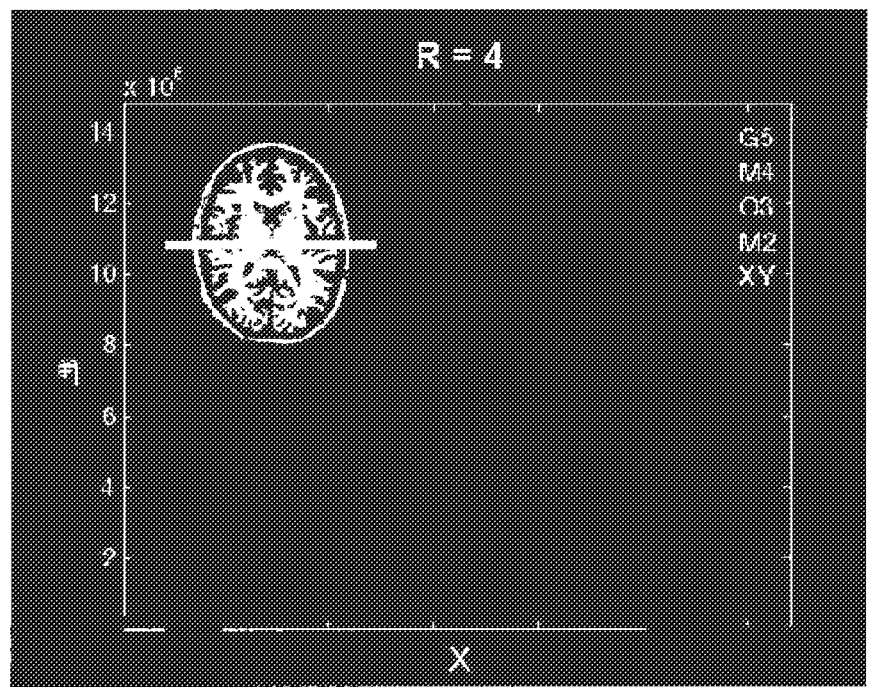
FIGS. 8(A) and 8(B) show the profiles of encoding efficiency at the 4-fold and the 8-fold accelerations, respectively, in the MDE MRI of the present invention.
Figure 8B:
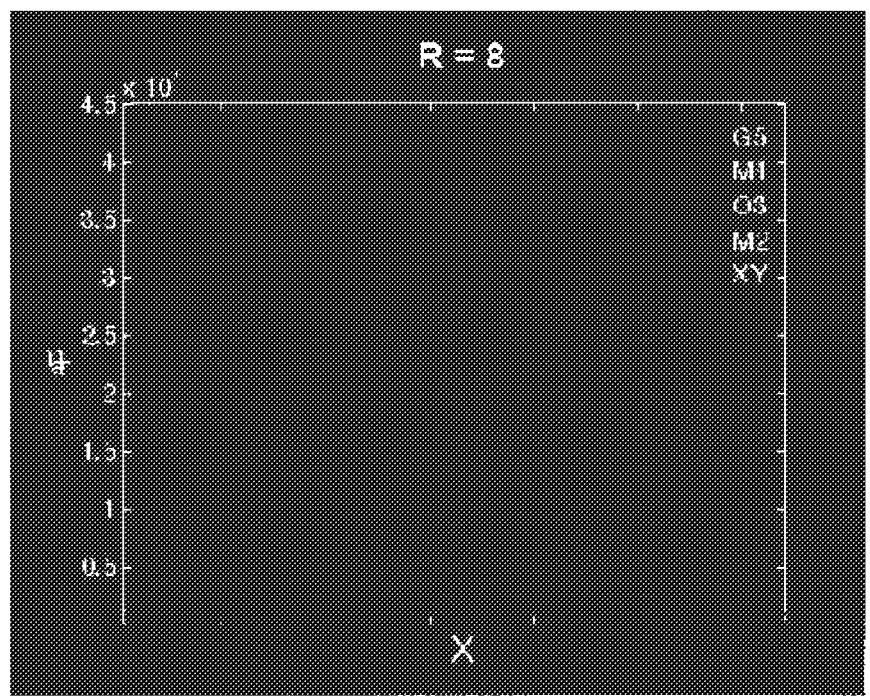

Furthermore, the encoding efficiency η is calculated to quantitatively compare the configurations of MDE MRI using nonlinear SEMs. FIGS. 8(A) and 8(B) show the respective profiles of encoding efficiency η at the 4-fold acceleration and at the 8-fold acceleration through a horizontal line passing through the center of the FOV. At R=4 (the 4-fold acceleration), as shown in FIG. 8(A), it is found that the G5 and M2 configurations have a peak around the center of FOV, while at periphery of the FOV the G5 configuration in general has a smaller η. • The relative efficiency with respect to the G5 configuration is calculated, from which it is found that the average of the relative efficiency of M4, O3, M2, L2 configuration, $h^{M4}/h^{G5}$, $h^{O3}/h^{G5}$, $h^{M2}/h^{G5}$, and $h^{XY}/h^{G5}$, are 1.25, 5.14, 2.27, and 4.37 respectively for R=4. These numbers indicates that in average the G5 configuration is more efficient than other four configurations. At R=8 (the 4-fold acceleration), as shown in FIG. 8(B), the efficiency of the G5 configuration is even more evident by showing a smaller η than other configurations. Specifically, the mean of $h^{M4}/h^{G5}$, $h^{O3}/h^{G5}$, $h^{M2}/h^{G5}$ and $h^{XY}/h^{G5}$ are 1.41, 2.19, 1.33, and 5.59 respectively for R=8. Since all relative efficiency is larger than 1, it is concluded that in average the MDE MRI of a higher dimension is more efficiency in spatial encoding.

Figure 9:
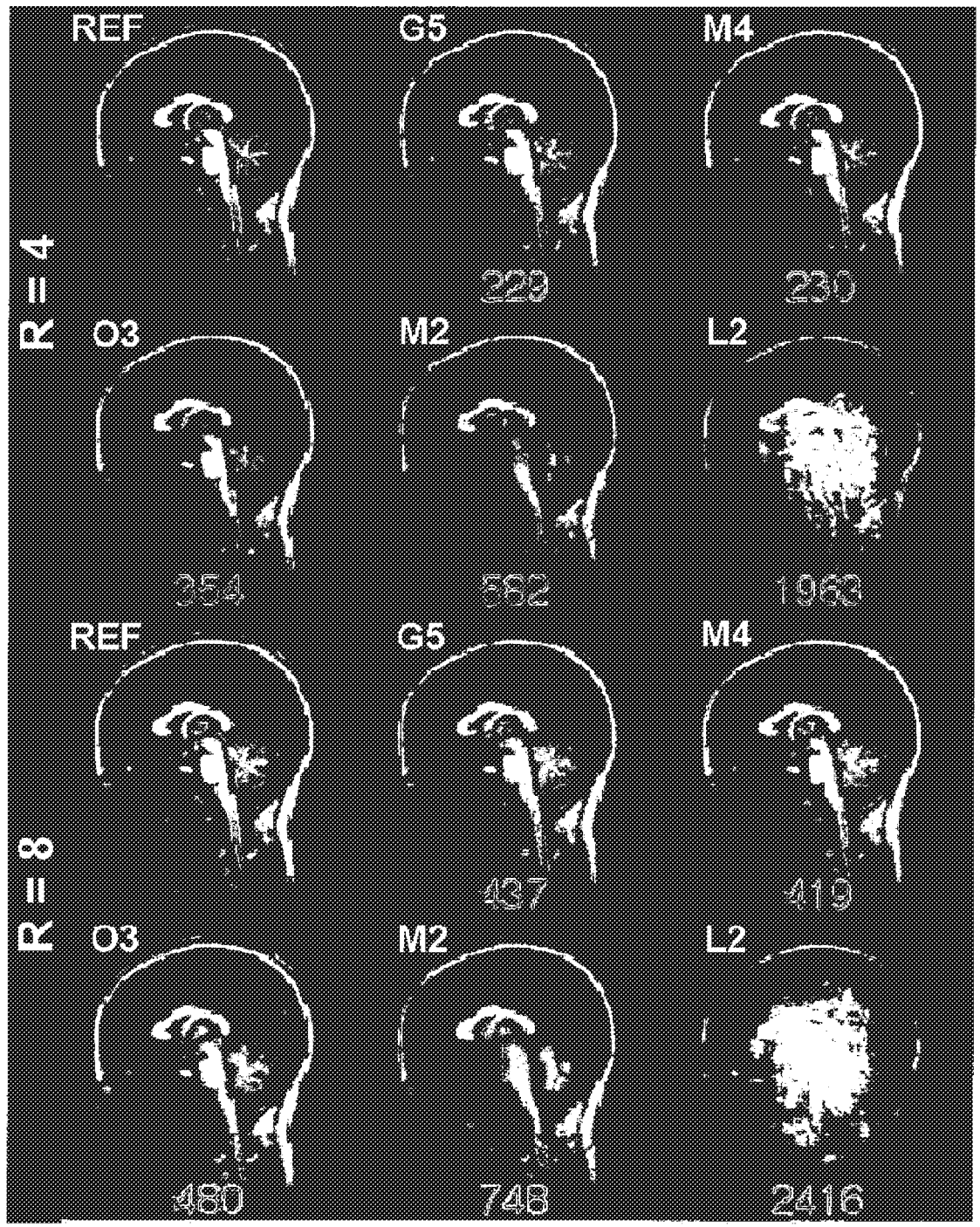
FIG. 9 and FIG. 10 show the reconstructed images of a coronal and sagittal slice and a mid-coronal slice images with the MDE MRI, respectively, with a relatively higher encoding space in accordance with the present invention.
Figure 10:
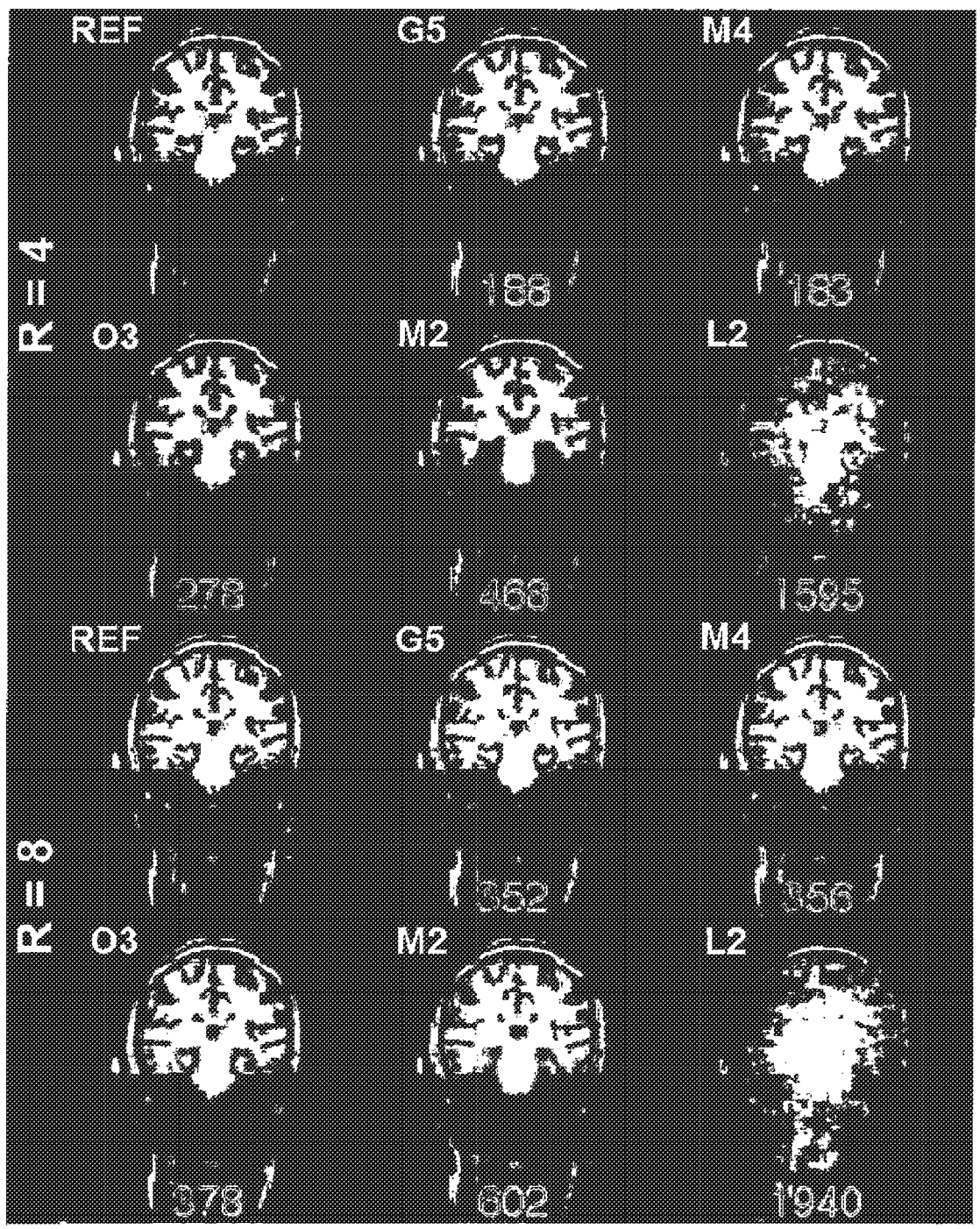

FIG. 9 shows the reconstructed images of a different coronal and sagittal slice images with the MDE MRI with a relatively higher encoding space in accordance with the present invention, and FIG. 10 shows the reconstructed images and the reconstruction errors of a mid-coronal slice using the 4-fold and 8 fold accelerated acquisitions. The reference image (REF) is also shown in the respective FIGS. 9 and 10 for comparison. Besides, the residual errors of the reconstructions are listed at the bottom of FIGS. 9 and 10 in cyan.

As shown in FIG. 9, with the use of 4-fold accelerated acquisitions, the quality of the reconstructed images is similar to the reconstructions in the basis optimization (FIG. 6): the M2 configuration has a prominent loss of spatial resolution around the center of the FOV and the O3 configuration has a blurred reconstruction. The M4 and G5 configurations give visually similar results yet the G5 configuration has a marginally smaller reconstruction error. As to the 8-fold acceleration reconstruction, the results are similar to those in the 4-fold accelerations: the reconstruction error decreases gradually as the number of dimension in the MDE MRI increases. The M4 and G5 configurations give visually similar results yet the M4 configuration has a marginally smaller reconstruction error. For each configuration, as shown in FIG. 10, the reconstructed image has a larger reconstruction error in R=8 than in R=4. Regardless of the acceleration rate, the G5 and M4 configurations give the least reconstruction errors compared to the O3, M2, and L2 configurations.

By means of the present invention, a framework of using sets of linear and nonlinear gradients to achieve MRI spatial encoding is provided. The present invention also provides a signal equation to encode a q-dimensional object onto a p-dimensional space, where p>q. In the present invention, embodiments aim to the cases of p=2 (two dimensional object) with q ranging between 2 and 5, and the reconstruction images show an enhanced resolution and efficiency for the present MDE MRI.

The present invention provides an encoding scheme by which the optimized spatial bases in a higher encoding dimension are shown to represent not only the target object but also the unknown objects more efficiently and accurately than those of lower dimensions.

The MDE MRI of the present invention is further advantageous in linking the recent PatLoc imaging and the O-space imaging approaches as a generalized MRI method using nonlinear and linear imaging gradients. The O-space imaging uses the Z2 imaging gradient and two linear SEMs, and the PatLoc imaging uses either two multipolar SEMs or the combination of two multipolar and two linear SEMs; however, the present MDE MRI provides a generalized scheme for PatLoc imaging regardless of the two linear SEMs and two multipolar SEMs are driven simultaneously or sequentially. With the capability of driving each surface gradient element independently, all SEMs in the PatLoc and O-space imaging can be generated using an array consisting of eight surface gradient elements distributed in azimuthal symmetry in the present invention. The MDE MRI of the present invention is practical for the recent demonstration of hardware.

According to the present invention, as the SEMs used in the MDE MRI include linear gradients, the image reconstruction would be enhanced over the conventional one due to the fact that the traditional k-space is a sub-space of the encoding space of MDE MRI. The potential applications of the present MDE MRI include imaging applications of different contrasts. From the teaching of the present invention, the skilled person may expect that the benefits of the present MDE MRI are available for both structural and dynamic MRI scans with the optimized bases. In addition, it is also expected that RF transmission using the present MDE MRI may have similar advantages of that of a conventional sensitivity encoding (SENSE): with a higher degree of freedom in controlling the imaging aliasing, MDE MRI may further reduce the SAR limitation in high field MRI to correct the B1 inhomogeneity.

In addition to the specific uses described above, other embodiments and uses of the invention will be apparent to those skilled in the art from consideration of the specification and practice of the invention disclosed herein. All documents referenced herein are specifically and entirely incorporated by reference. The specification and examples should be considered exemplary only with the true scope and spirit of the invention indicated by the following claims. As will be easily understood by those of ordinary skill in the art, variations and modifications of each of the disclosed embodiments can be easily made within the scope of this invention as defined by the following claims.

What is claimed is:

1. A method of generating magnetic resonance images of an q-dimensional object using a magnetic resonance imaging (MRI) system having a subsystem generating a number of m of spatial encoding magnetic fields (SEMs) to encode an excited magnetization and a receiver coil array of a number of p of receiver coils for detecting the excited magnetization, comprising the steps of:

a) choosing, from the generated SEMs, at least one SEMs having moronically field strength and direction distributions or non-monotonically field strength and direction distributions within a selected field-of-view (FOV);

b) determining, for each of the chosen SEMs, a corresponding spatial basis from the rise time, duration, and ramp-down time of the chosen SEM; and c) reconstructing an image of the q-dimensional object based on the data points obtained at each of the receiver coils at each of the spatial bases;

wherein the generated SEMs include one of SEMs that are spatially bijective, SEMs that are non-bijective, and the combination thereof within the selected FOV, with m being equal to or larger than q, and wherein the receiver coils have a number of spatially distinct sensitivity maps which is equal to or less than p.

2. The method according to claim 1, wherein at the step a), the SEMs are generated with at least one linear gradient coils.

3. The method according to claim 1, wherein at the step b), the spatial basis is determined by:
   b1) selecting a target object and calculating, for each of the chosen SEMs, a projection coefficient as a spatial integral over the selected FOV about a product between the target object and the chosen spatial basis, which is defined as a spatial distribution of complex values, and the sensitivity map of one channel of the receiver coil array;
   b2) choosing, from a collection of the projection coefficients obtained at the step b1), a desired spatial distribution, strength, and duration of the SEMs, the collection of projection coefficients comprising the respective data point obtained at each of the receiver coils;
   b3) subtracting the product of the chosen projection coefficient and the chosen SEM from the target object; and
   b4) repeating the steps b1) and b2) for all of the data points obtained at the receiver coils.

4. The method according to claim 3, wherein the defined spatial distribution of complex values at the step b1) have the same magnitudes over the selected FOV and different phases at different locations in the selected field-of-view.

5. The method according to claim 4, wherein the respective phase of the spatial basis is defined as a spatial distribution of the product of the magnetic field strength of the chosen SEM, the strength of driving current for the chosen SEM, and the duration of the chosen SEM.

6. A non-transitory computer readable medium having thereon computer program proceeded by a computer processor for generating magnetic resonance images of an q-dimensional object with a magnetic resonance imaging (MRI) system having a subsystem generating a number of m of spatial encoding magnetic fields (SEMs) to encode an excited magnetization and a number of p of receiver coils for detecting the excited magnetization, when executed by the computer processor, the computer program causing the computer processor to execute the following:

choosing, from the generated SEMs, at least one SEMs having moronically field strength and direction distributions or non-monotonically field strength and direction distributions within a selected field-of-view (FOV);

determining, for each of the chosen SEMs, a corresponding spatial basis from the rise time, duration, and ramp-down time of the chosen SEM; and reconstructing an image of the n-dimensional object based on data points obtained at each of the receiver coils at each of the spatial bases;

wherein the generated SEMs include one of SEMs that are spatially bijective, SEMs that are non-bijective, and the combination thereof within the selected FOV, with m being equal to or larger than q, and wherein the receiver coils have a number of spatially distinct sensitivity maps which is equal to or less than p.

\* \* \* \* \*